(12) United States Patent
Huang (10) Patent No.: US 6,372,551 B1
(45) Date of Patent: Apr. 16, 2002

(54) METHOD OF MANUFACTURING AN IMAGE-SENSOR INTEGRATED CIRCUIT PACKAGE WITHOUT RESIN FLASH ON LEAD FRAME AND WITH INCREASED WIRE BONDABILITY

(75) Inventor: Chien Ping Huang, Hsinchu Hsien (TW)

(73) Assignee: Siliconware Precison Industries Co., Ltd., Taichung (TW)

( * ) Notice: Subject to any disclaimer, the term of this patent is extended or adjusted under 35 U.S.C. 154(b) by 0 days.

(21) Appl. No.: 09/571,117

(22) Filed: May 12, 2000

(51) Int. Cl.⁷ .................. H01L 21/44; H01L 21/48; H01L 21/50
(52) U.S. Cl. ........................... 438/124; 438/106
(58) Field of Search ............... 438/106, 108, 438/118, 121, 124, 125, 126, 128, 51, 55, 122, 127

(56) References Cited

U.S. PATENT DOCUMENTS

| | | | |
|---|---|---|---|
| 4,630,172 A | * 12/1986 | Stenerson et al. | 361/386 |
| 5,523,608 A | * 6/1996 | Kitaoka et al. | 257/433 |
| 5,722,161 A | * 3/1998 | Marrs | 29/841 |
| 5,731,754 A | * 3/1998 | Lee, Jr. et al. | 340/447 |
| 6,211,462 B1 | * 4/2001 | Carter, Jr. et al. | 174/52.4 |
| 6,262,480 B1 | * 7/2001 | Ferri et al. | 257/706 |

* cited by examiner

Primary Examiner—David Nelms
Assistant Examiner—Phuc T. Dang
(74) Attorney, Agent, or Firm—Peter F. Corless; Steven M. Jensen; Edwards & Angell, LLP

(57) ABSTRACT

An integrated circuit (Integrated Circuit) packaging method is proposed, which can be used to pack an Integrated Circuit chip of an optically-sensitive type, such as an image-sensor Integrated Circuit chip, and which can help prevent resin flash on lead frame and help increase wire bondability. The proposed Integrated Circuit packaging method can help prevent resin flash on the die-pad portion and the inner end of the finger portion of the lead frame. This benefit allows the die attachment on the die-pad portion of the lead frame to be more reliable than the prior art. Moreover, the proposed Integrated Circuit packaging method allows lead frame to come into direct thermal contact with heat block during wire-bonding process, so that it allows an increased level of bondability to the bonding wires, making the Integrated Circuit package more assured in quality and more reliable to use than the prior art.

9 Claims, 6 Drawing Sheets

METHOD OF MANUFACTURING AN IMAGE-SENSOR INTEGRATED CIRCUIT PACKAGE WITHOUT RESIN FLASH ON LEAD FRAME AND WITH INCREASED WIRE BONDABILITY

BACKGROUND OF THE INVENTION

1. Field of the Invention

This invention relates to integrated circuit (IC) packaging technology, and more particularly, to an Integrated Circuit packaging method for packaging an Integrated Circuit chip of an optically-sensitive type, such as an image-sensor Integrated Circuit chip, which can help prevent resin flash on lead frame and help increase wire bondability.

2. Description of Related Art

Integrated Circuit packaging technology is used to pack one or more Integrated Circuit chips in a single module. Typically, the Integrated Circuit chip or chips are enclosed within an opaque encapsulating body, and thus is invisible from the outside. However, for image-sensor Integrated Circuit chips, it is required to allow them to detect outside light to serve their function. For this reason, a special Integrated Circuit package configuration is used to pack Integrated Circuit chips of optically-sensitive types.

One problem to the manufacture of the image-sensor Integrated Circuit chips, however, is that the resin used to form the package body could easily flash onto the lead frame surface, which would then undesirably degrade the quality of the die attachment and wire bonding on the lead frame surface in subsequent processes. Conventionally, various Integrated Circuit packaging methods have been proposed to eliminate the flash problem, including, for example, the U.S. Pat. No. 5,070,041 and the U.S. Pat. No. 5,523,608.

The U.S. Pat. No. 5,070,041 discloses an Integrated Circuit packaging method for manufacturing a single-chip image-sensor Integrated Circuit package, which is briefly depicted in the following with reference to FIGS. 1A–1D.

Figure 1A:
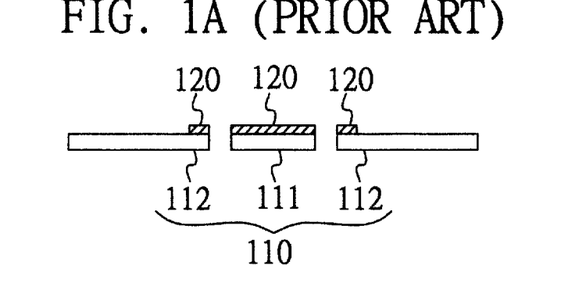
FIGS. 1A–1D (PRIOR ART) are schematic sectional diagrams used to depict the procedural steps involved in a first conventional Integrated Circuit packaging method for manufacturing a single-chip image-sensor Integrated Circuit package.

Referring to FIG. 1A, by the U.S. Pat. No. 5,070,041, the first step is to prepare a lead frame 110 of the type having a die-pad portion 111 and a finger portion 112. To prevent flash, a polymer precoating 120 is formed over the die-pad portion 111 and the inner end of the finger portion 112.

Figure 1B:
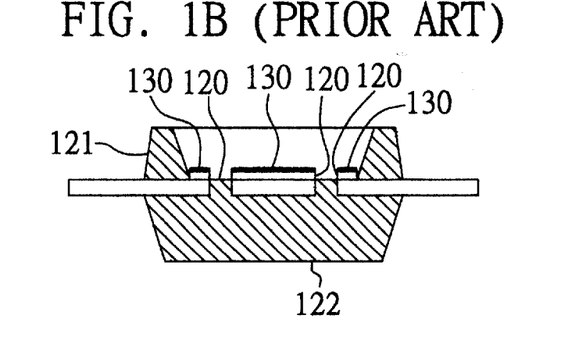

Referring further to FIG. 1B, in the next step, a molding process is performed to form a top package body 121 and a bottom package body 122. The top package body 121 is centrally-hollowed for die attachment. During this molding process, however, the resin used to form the top and bottom package bodies 121, 122 would undesirably flash onto the die-pad portion 111 and the inner end of the finger portion 112 of the lead frame 110 (the flashed resin is here pointed out by the reference numeral 130). Since these lead frame portions are pre-coated with the polymer precoating 120, the flashed resin 130 thereon can be subsequently removed by using a special solvent.

Figure 1C:
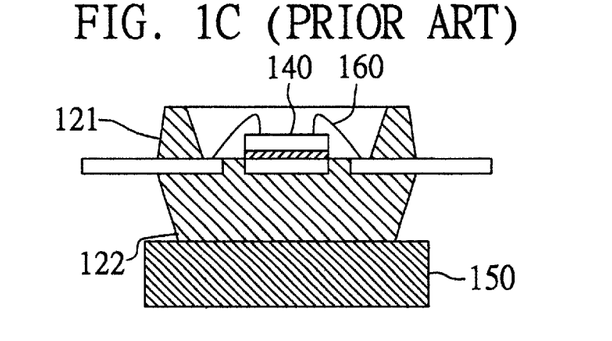

Referring further to FIG. 1C, in the next step, a die-attachment process is performed to attach an image-sensor Integrated Circuit chip 140 on the die-pad portion 111 of the lead frame 110. Subsequently, with the bottom package body 122 being fixed over a heat block 150, a wire-bonding process is performed to apply a set of bonding wires 160 for electrically coupling the image-sensor Integrated Circuit chip 140 to the inner end of the finger portion 112 of the lead frame 110.

Figure 1D:
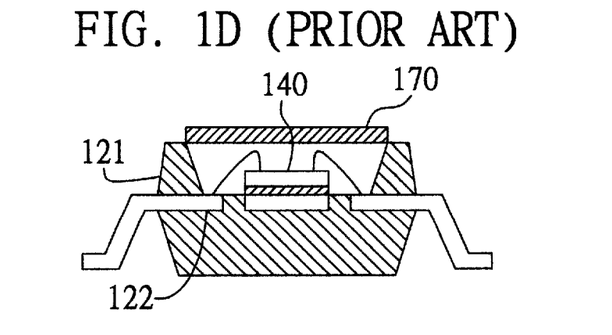

Referring further to FIG. 1D, in the next step, a lidding process is performed to cover a transparent lid 170 onto the top opening of the top package body 121 to thereby hermetically seal the image-sensor Integrated Circuit chip 140. This completes the manufacture of the single-chip image-sensor Integrated Circuit package.

The foregoing Integrated Circuit packaging method, however, has two drawbacks. First, it is quite costly to implement the forming of the polymer precoating 120 and the subsequent solvent cleaning of the flashed resin 130 over the polymer precoating 120, which makes the overall manufacture process quite cost-ineffective. Second, during the wire-bonding process, since the heat block 150 is in direct thermal contact with the resin-made bottom package body 122 rather than with the lead frame 110, the heat transfer from the heat block 150 to the lead frame 110 would be inadequate, thus undesirably resulting in a poor bondability to the bonding wires 160. There exists therefore a need for a new Integrated Circuit packaging method that can eliminate the flash problem in a more cost-effective way and also allows a better heat transfer to the die pad during the wire-bonding process.

The U.S. Pat. No. 5,523,608 discloses an Integrated Circuit packaging method used to manufacture a dual-chip image-sensor Integrated Circuit package, which is briefly depicted in the following with reference to FIGS. 2A–2D.

Figure 2A:
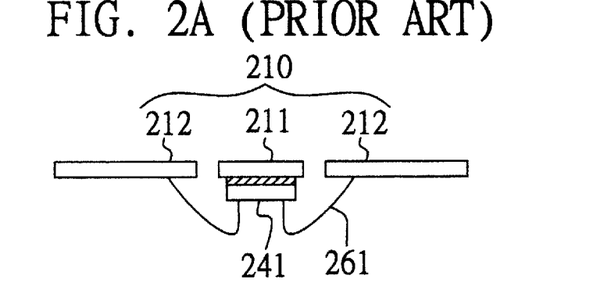
FIGS. 2A–2D (PRIOR ART) are schematic sectional diagrams used to depict the procedural steps involved in a second conventional Integrated Circuit packaging method for manufacturing a dual-chip image-sensor Integrated Circuit package.

Referring to FIG. 2A, by the U.S. Pat. No. 5,523,608, the first step is to prepare a lead frame 210 of the type having a die-pad portion 211 and a finger portion 212. Next, a first die-attachment process is performed to attach a first Integrated Circuit chip 241 on the back side of the die-pad portion 211 of the lead frame 210. After this, a first wire-bonding process is performed to apply a first set of bonding wires 261 for electrically coupling the first Integrated Circuit chip 241 to the back side of the inner end of the finger portion 212 of the lead frame 210.

Figure 2B:
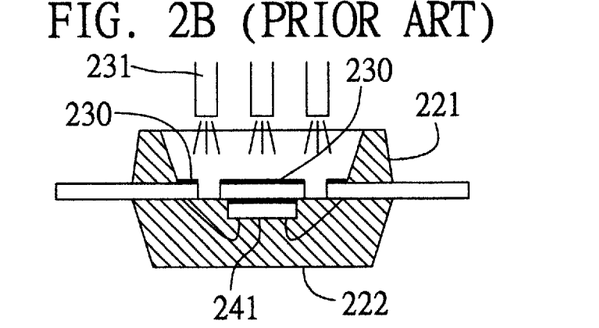

Referring further to FIG. 2B, in the next step, a molding process is performed to form a top package body 221 and a bottom package body 222. The top package body 221 is centrally-hollowed for die attachment. During this molding process, however, the resin used to form the top and bottom package bodies 221, 222 would undesirably flash onto the front side of the die-pad portion 211 and the inner end of the finger portion 212 of the lead frame 210 (the flashed resin is here pointed out by the reference numeral 230). A blast process is then performed by the use of a blaster 231 to clean the flashed resin 230 away.

Figure 2C:
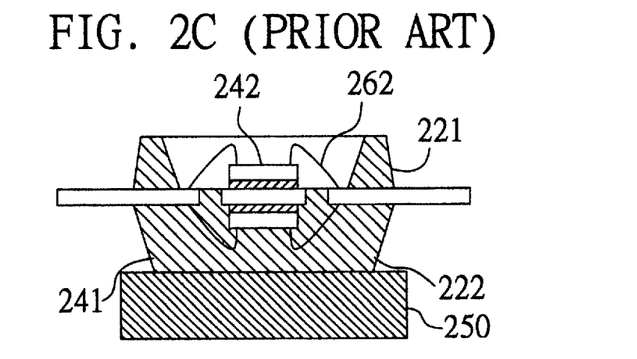

Referring further to FIG. 2C, in the next step, a second die-attachment process is performed to attach a second Integrated Circuit chip 242 (image-sensor Integrated Circuit chip) on the front side of the die-pad portion 211 of the lead frame 210. Subsequently, with the bottom package body 222 being fixed over a heat block 250, a second wire-bonding process is performed to apply a second set of bonding wires 262 for electrically coupling the second Integrated Circuit chip 242 to the front side of the inner end of the finger portion 212 of the lead frame 210.

Figure 2D:
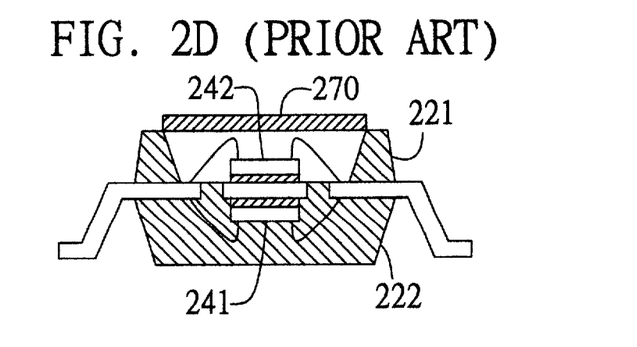

Referring further to FIG. 2D, in the next step, a lidding process is performed to cover a transparent lid 270 onto the top opening of the top package body 221 to thereby hermetically seal the second Integrated Circuit chip 242. This completes the manufacture of the dual-chip image-sensor Integrated Circuit package.

The foregoing Integrated Circuit packaging method, however, also has two drawbacks. First, it is quite costly to implement the blast process to clean the flashed resin, which makes the overall manufacture process quite cost-ineffective. Second, during the second wire-bonding process, since the heat block 250 is in direct thermal contact with the resin-made bottom package body 222 rather than with the lead frame 210, the heat transfer from the heat block 250 to the lead frame 210 would be inadequate, thus undesirably resulting in a poor bondability to the second set of bonding wires 262. There exists therefore a need for a new Integrated Circuit packaging method that can eliminate the flash problem in a more cost-effective way and also allows a better heat transfer to the die pad during the second wire-bonding process.

SUMMARY OF THE INVENTION

It is the primary objective of this invention to provide a new Integrated Circuit packaging method which can help solve the above-mentioned flash problem.

It is another objective of this invention to provide a new Integrated Circuit packaging method which allows the lead frame to come in direct thermal contact with the heat block during wire-bonding process.

In accordance with the foregoing and other objectives, the invention proposes a new Integrated Circuit packaging method for image-sensor Integrated Circuit chips. The Integrated Circuit packaging method of the invention can help prevent resin flash on the die-pad portion and the inner end of the finger portion of the lead frame. This benefit allows the die attachment on the die-pad portion to be more reliable than the prior art. Moreover, the Integrated Circuit packaging method of the invention allows lead frame to come into direct thermal contact with heat block during wire-bonding process, so that it allows an increased level of bondability to the bonding wires, making the Integrated Circuit package more assured in quality and more reliable to use than the prior art.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

In accordance with the invention, two preferred embodiments are disclosed in full details in the following with reference to FIGS. 3A–3E and FIGS. 4A–4F respectively.

First Preferred Embodiment (FIGS. 3A–3E)

The first preferred embodiment of the Integrated Circuit packaging method of the invention is disclosed in full details in the following with reference to FIGS. 3A–3E. This embodiment is specifically used to manufacture a single-chip image-sensor Integrated Circuit package.

Figure 3A:
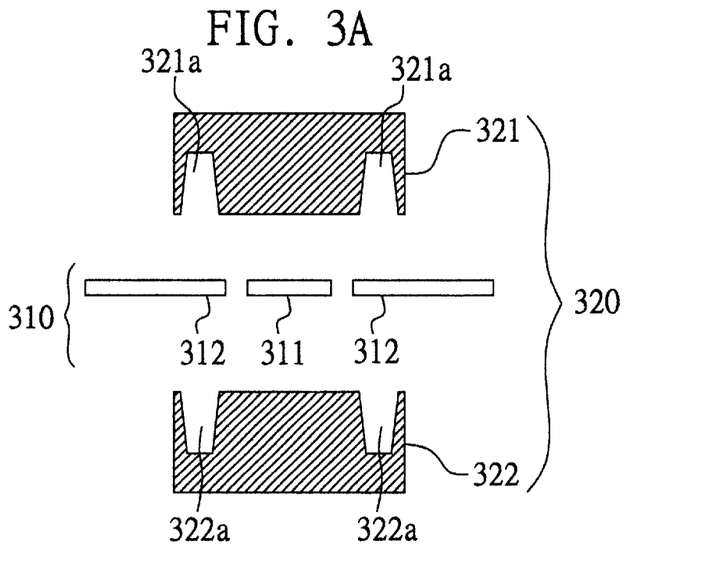
FIGS. 3A–3E are schematic sectional diagrams used to depict the procedural steps involved in a first preferred embodiment of the method of the invention in the case of manufacturing a single-chip image-sensor Integrated Circuit package.

Referring to FIG. 3A, the first step is to prepare a lead frame 310 and a encapsulating mold 320. The lead frame 310 is of the type having a die-pad portion 311 and a finger portion 312. The encapsulating mold 320 includes two units: a top inserted mold 321 and a bottom inserted mold 322. The top inserted mold 321 is formed with a first side-wall cavity structure 321a (so named because it will be later used for the forming of a top side-wall structure serving as part of the package body), while the bottom inserted mold 322 is formed with a second side-wall cavity structure 322a (so named because it will be later used for the forming of a bottom side-wall structure).

Figure 3B:
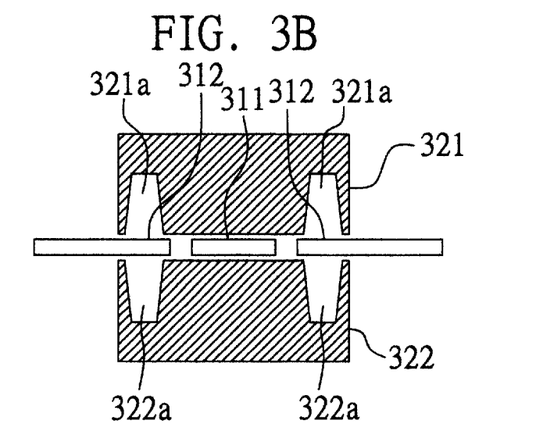

Referring further to FIG. 3B, in the next step, the lead frame 310 is clamped tightly between the top and bottom inserted molds 321, 322 in such a manner that the die-pad portion 311 and the inner end of the finger portion 312 of the lead frame 310 would be substantially airtightly covered by the solid portions of the top and bottom inserted molds 321, 322, while allowing the first and second side-wall cavity structures 321a, 322a to be substantially aligned to each other at a predefined section of the finger portion 312 of the lead frame 310. With this, a molding process is performed to fill a molding material, such as resin, into the first and second side-wall cavity structures 321a, 322a.

Figure 3C:
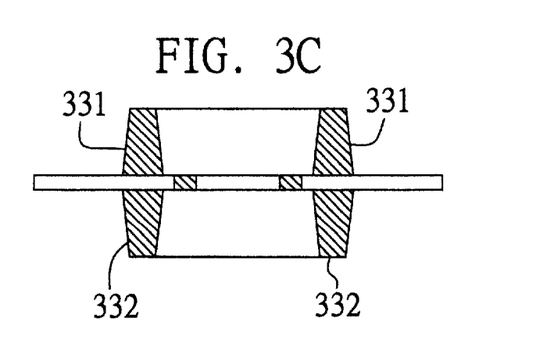

Referring further to FIG. 3C, in the next step, both the top and bottom inserted molds 321, 322 are removed. Through the molding process, a top side-wall structure 331 is formed from the molding material filled into the first side-wall cavity structure 321a in the top inserted mold 321, while a bottom side-wall structure 332 is formed from the molding material filled into the second side-wall cavity structure 322a in the bottom inserted mold 322.

It is a characteristic feature of the invention that, due to the airtight clamping by the top and bottom inserted molds 321, 322, the die-pad portion 311 and the inner end of the finger portion 312 of the lead frame 310 would be substantially untouched by the molding material, and are thus substantially flash-free.

Figure 3D:
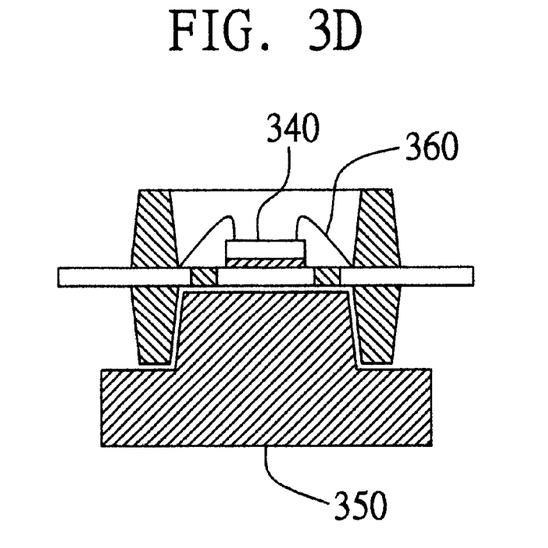

Referring further to FIG. 3D, in the next step, a die-attachment process is performed to attach an image-sensor Integrated Circuit chip 340 on the front side of the die-pad portion 311 of the lead frame 310.

Subsequently, with the semi-finished package being fixed over a heat block 350, a wire-bonding process is performed to apply a set of bonding wires 360 for electrically coupling the image-sensor Integrated Circuit chip 340 to the inner end of the finger portion 312 of the lead frame 310. After this process is completed, the semi-finished package is removed from the heat block 350.

It is a characteristic feature of the invention that since the bottom side-wall structure 332 is centrally-hollowed, the heat block 350 can be shaped in such a manner as shown in FIG. 3D so as to allow it to come into direct thermal contact with the die-pad portion 311 and the inner end of the finger portion 312 of the lead frame 310. This allows a significantly better heat transfer from the heat block 350 to the lead frame 310 during the wire-bonding process.

Figure 3E:
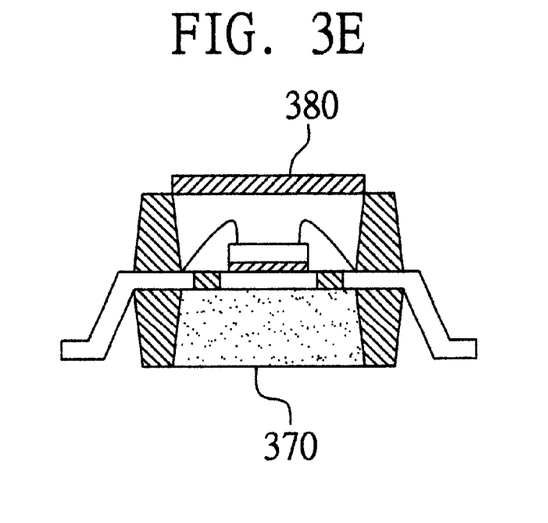

Referring finally to FIG. 3E, in the next step, epoxy or silicone is filled into the centrally-hollowed portion of the bottom side-wall structure 332 to form a base encapsulating block 370 to encapsulate the bottom side of the die-pad portion 311 and the inner end of the finger portion 312 of the lead frame 310.

In the final step, a lidding process is performed to cover a transparent lid 380 onto the top opening of the top side-wall structure 331 to thereby hermetically seal the image-sensor Integrated Circuit chip 340. This completes the manufacture of the image-sensor Integrated Circuit package.

It can be learned from the forgoing description that the Integrated Circuit packaging method of the invention can help prevent resin flash on the die-pad portion 311 and the inner end of the finger portion 312 of the lead frame 310. This benefit allows the attachment of the image-sensor Integrated Circuit chip 340 on the die-pad portion 311 to be more reliable than the prior art. Moreover, since the invention allows the lead frame 310 to come into direct thermal contact with the heat block 350 during the wire-bonding process, it allows an increased level of bondability to the bonding wires 360, making the Integrated Circuit package more assured in quality and more reliable to use than the prior art. The invention is therefore more advantageous to use than the prior art.

Second Preferred Embodiment (FIGS. 4A–4F)

The second preferred embodiment of the Integrated Circuit packaging method of the invention is disclosed in full details in the following with reference to FIGS. 4A–4F. This embodiment is specifically used to manufacture a dual-chip image-sensor Integrated Circuit package.

Figure 4A:
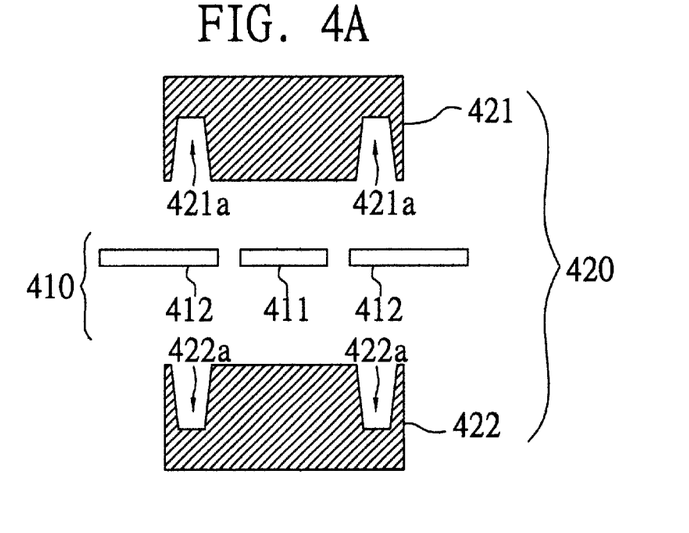
FIGS. 4A–4F are schematic sectional diagrams used to depict the procedural steps involved in a second preferred embodiment of the method of the invention in the case of manufacturing a dual-chip image-sensor Integrated Circuit package.

Referring to FIG. 4A, the first step is to prepare a lead frame 410 and a encapsulating mold 420. The lead frame 410 is of the type having a die-pad portion 411 and a finger portion 412. The encapsulating mold 420 includes two units: a top inserted mold 421 and a bottom inserted mold 422. The top inserted mold 421 is formed with a first side-wall cavity structure 421a (so named because it will be later used for the forming of a top side-wall structure serving as part of the entire package body), while the bottom inserted mold 422 is formed with a second side-wall cavity structure 422a (so named because it will be later used for the forming of a bottom side-wall structure).

Figure 4B:
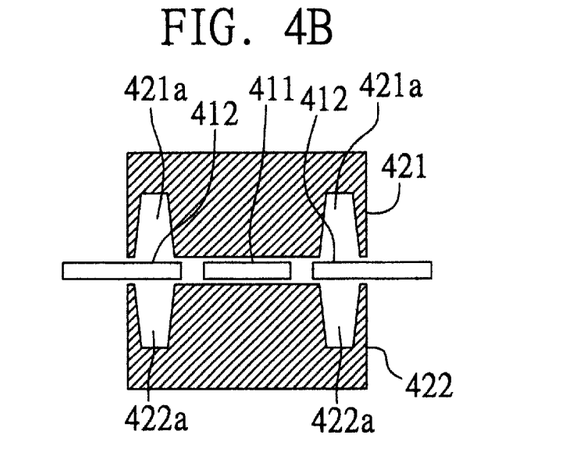

Referring to FIG. 4B, in the next step, the lead frame 410 is clamped tightly between the top and bottom inserted molds 421, 422 in such a manner that the die-pad portion 411 and the inner end of the finger portion 412 of the lead frame 410 would be substantially airtightly covered by the solid portions of the top and bottom inserted molds 421, 422, while allowing the first and second side-wall cavity structures 421a, 422a to be substantially aligned to each other at a predefined section of the finger portion 412 of the lead frame 410. After this, a molding process is performed to fill a molding material, such as resin, into the first and second side-wall cavity structures 421a, 422a.

Figure 4C:
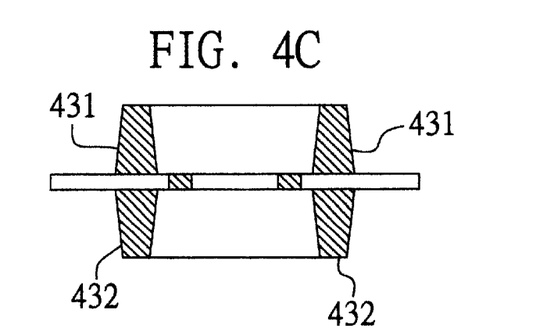

Referring further to FIG. 4C, in the next step, both the top and bottom inserted molds 421, 422 are removed. Through the molding process, a top side-wall structure 431 is formed from the molding material filled into the first side-wall cavity structure 421a in the top inserted mold 421, while a bottom side-wall structure 432 is formed from the molding material filled into the second side-wall cavity structure 422a in the bottom inserted mold 422.

It is a characteristic feature of the invention that, due to the airtight clamping by the top and bottom inserted molds 421, 422, the die-pad portion 411 and the inner end of the finger portion 412 of the lead frame 410 would be substantially untouched by the molding material, and are thus substantially flash-free.

Figure 4D:
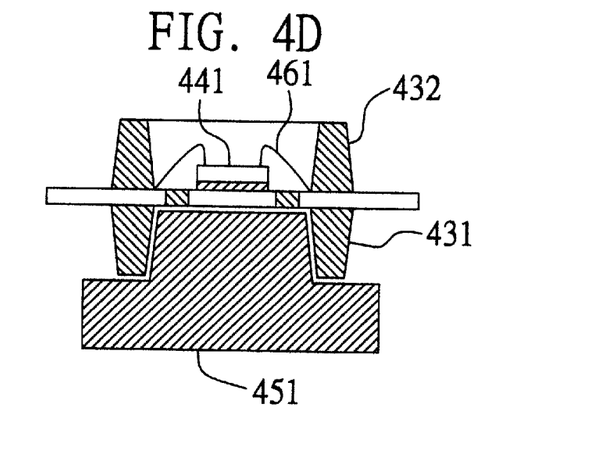

Referring to FIG. 4D, in the next step, with the lead frame 410 being turned upside down, a first die-attachment process is performed to attach a first Integrated Circuit chip 441 on the back side of the die-pad portion 411 of the lead frame 410 Subsequently, with the semi-finished package being fixed over a first heat block 451, a first wire-bonding process is performed to apply a first set of bonding wires 461 for electrically coupling the first Integrated Circuit chip 441 to the back side of the inner end of the finger portion 412 of the lead frame 410.

It is a characteristic feature of the invention that since the bottom side-wall structure 432 is centrally-hollowed, the first heat block 451 can be shaped in such a manner as shown in FIG. 4D so as to allow it to come into direct thermal contact with the die-pad portion 411 and the inner end of the finger portion 412 of the lead frame 410. This allows a significantly better heat transfer from the first heat block 451 to the lead frame 410 during the first wire-bonding process.

Figure 4E:
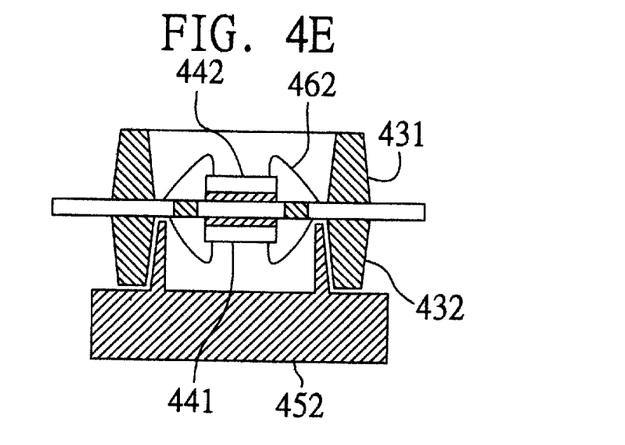

Referring further to FIG. 4E, in the next step, a second die-attachment process is performed to attach a second Integrated Circuit chip 442 (image-sensor Integrated Circuit chip) on the front side of the die-pad portion 411 of the lead frame 410. Subsequently, with the semi-finished package being fixed over a second heat block 452, a second wire-bonding process is performed to apply a second set of bonding wires 462 for electrically coupling the second Integrated Circuit chip 442 to the front side of the inner end of the finger portion 412 of the lead frame 410.

It is a characteristic feature of the invention that since the top side-wall structure 431 is centrally-hollowed, the second heat block 452 can be shaped in such a manner as shown in FIG. 4E so as to allow it to come into direct thermal contact with the inner end of the finger portion 412 of the lead frame 410. This allows a significantly better heat transfer from the second heat block 452 to the finger portion 412 of the lead frame 410 where the second set of bonding wires 462 are bonded, thus providing an increased level of bondability to the second set of bonding wires 462 as compared to the prior art.

Figure 4F:
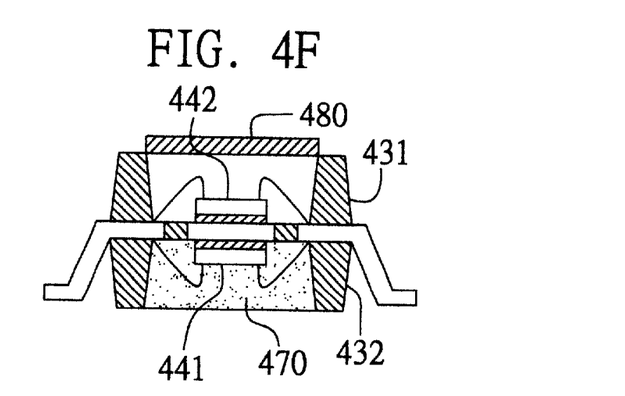

Referring finally to FIG. 4F, in the next step, epoxy or silicone is filled into the centrally-hollowed portion of the bottom side-wall structure 432 to form a bottom encapsulating body 470 to encapsulate the first Integrated Circuit chip 441. Finally, a lidding process is performed to cover a transparent lid 480 onto the top opening of the top side-wall structure 431 to thereby hermetically seal the second Integrated Circuit chip 442. This completes the manufacture of the dual-chip image-sensor Integrated Circuit package.

It can be learned from the forgoing description that the Integrated Circuit packaging method of the invention can help prevent resin flash on the die-pad portion 411 and the inner end of the finger portion 412 of the lead frame 410. This benefit allows the die attachment on the die-pad portion 411 to be more reliable than the prior art. Moreover, since the invention allows the lead frame 410 to come into direct thermal contact with the first heat block 451 during the first wire-bonding process and with the second heat block 452 during the second wire-bonding process, it allows an increased level of bondability to the two sets of bonding wires 461, 462, thus making the Integrated Circuit package more assured in quality and more reliable to use than the prior art. The invention is therefore more advantageous to use than the prior art.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. An Integrated Circuit packaging method, comprising the steps of:

(1) preparing a lead frame having a die-pad portion and a finger portion;

(2) preparing an encapsulating mold including a top inserted mold and a bottom inserted mold, wherein the top inserted mold is formed with a first side-wall cavity structure while the bottom inserted mold is formed with a second side-wall cavity structure;

(3) clamping the lead frame between the top inserted mold and the bottom inserted mold in such a manner that the die-pad portion and the inner end of the finger portion of the lead frame would be substantially airtightly covered between the top inserted mold and the bottom inserted mold;

(4) filling a molding material into the first side-wall cavity structure in the top inserted mold to thereby form a top side-wall structure having a centrally-hollowed portion, and also into the second side-wall cavity structure in the bottom inserted mold to thereby form a bottom side-wall structure having a centrally-hollowed portion;

(5) removing the encapsulating mold;

(6) performing a die-attachment process to attach at least one Integrated Circuit chip on the die-pad portion of the lead frame;

(7) performing a wire-bonding process to electrically couple the Integrated Circuit chip to the inner end of the finger portion of the lead frame, and in which step the bottom side-wall structure is placed on a heat block shaped in such a manner that allows the die-pad portion and the inner end of the finger portion to come in direct thermal contact with the heat block through the centrally-hollowed portion of the bottom side-wall structure;

(8) Removing the heat block; and (9) performing a lidding process to cover a lid onto the opening of the top side-wall structure.

2. The Integrated Circuit packaging method of claim 1, wherein the Integrated Circuit chip is an image-sensor Integrated Circuit chip.

3. The Integrated Circuit packaging method of claim 1, wherein a base encapsulating block is further formed in the centrally-hollowed portion of the bottom side-wall structure.

4. The Integrated Circuit packaging method of claim 3, wherein the base encapsulating block is formed by filling epoxy into the centrally-hollowed portion of the bottom side-wall structure.

5. The Integrated Circuit packaging method of claim 3, wherein the base encapsulating block is formed by filling silicone into the centrally-hollowed portion of the bottom side-wall structure.

6. An Integrated Circuit packaging method, comprising the steps of:

(1) preparing a lead frame having a die-pad portion and a finger portion;

(2) preparing an encapsulating mold including a top inserted mold and a bottom inserted mold, wherein the top inserted mold is formed with a first side-wall cavity structure while the bottom inserted mold is formed with a second side-wall cavity structure;

(3) clamping the lead frame between the top inserted mold and the bottom inserted mold in such a manner that the die-pad portion and the inner end of the finger portion of the lead frame would be substantially airtightly covered between the top inserted mold and the bottom inserted mold;

(4) filling a molding material into the first side-wall cavity structure in the top inserted mold to thereby form a top side-wall structure having a centrally-hollowed portion, and also into the second side-wall cavity structure in the bottom inserted mold to thereby form a bottom side-wall structure having a centrally-hollowed portion;

(5) removing the encapsulating mold;

(6) performing a first die-attachment process to attach a first Integrated Circuit chip on the back side of the die-pad portion of the lead frame; and then performing a first wire-bonding process to electrically couple the first Integrated Circuit chip to the back side of the inner end of the finger portion of the lead frame, and in which step the bottom side-wall structure is placed on a first heat block shaped in such a manner that allows the front side of the die-pad portion and the inner end of the finger portion to come in direct thermal contact with the first heat block through the centrally-hollowed portion of the top side-wall structure;

(7) performing a second die-attachment process to attach a second Integrated Circuit chip on the front side of the die-pad portion of the lead frame; and then performing a second wire-bonding process to electrically couple the second Integrated Circuit chip to the front side of the inner end of the finger portion of the lead frame, and in which step the bottom side-wall structure is placed on a second heat block shaped in such a manner that allows the back side of the die-pad portion and the inner end of the finger portion to come in direct thermal contact with the second heat block through the centrally-hollowed portion of the bottom side-wall structure;

(8) forming a base encapsulating block in the centrally-hollowed portion of the bottom side-wall structure after the second heat block is removed; and (9) performing a lidding process to cover a lid onto the opening of the top side-wall structure.

7. The Integrated Circuit packaging method of claim 6, wherein the second Integrated Circuit chip is an image-sensor Integrated Circuit chip.

8. The Integrated Circuit packaging method of claim 6, wherein in said step (8), the base encapsulating block is formed by filling epoxy into the centrally-hollowed portion of the bottom side-wall structure.

9. The Integrated Circuit packaging method of claim 6, wherein in said step (8), the base encapsulating block is formed by filling silicone into the centrally-hollowed portion of the bottom side-wall structure.

* * * * *